(12) United States Patent (10) Patent No.: US 9,054,660 B1
Ramalingam et al. (45) Date of Patent: Jun. 9, 2015

(54) AMPLIFYING SYSTEM

(71) Applicants: Kirubakaran Ramalingam, Kerala (IN); Rabeesh Vadassery Gopinathan, Ernakulam (IN); Kaushal Kumar Jha, Bangalore (IN); Damien J. McCartney, Raheen (IE)

(72) Inventors: Kirubakaran Ramalingam, Kerala (IN); Rabeesh Vadassery Gopinathan, Ernakulam (IN); Kaushal Kumar Jha, Bangalore (IN); Damien J. McCartney, Raheen (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/152,515

(22) Filed: Jan. 10, 2014

(51) Int. Cl.
*H03F 1/48* (2006.01)
*H03F 3/45* (2006.01)
*H03G 3/00* (2006.01)
*H03M 1/66* (2006.01)
*H03M 1/70* (2006.01)
*H03G 3/30* (2006.01)

(52) U.S. Cl.
CPC ............. *H03G 3/001* (2013.01); *H03M 1/664* (2013.01); *H03M 1/70* (2013.01); *H03G 3/30* (2013.01)

(58) Field of Classification Search
CPC ............. H03F 3/3022; H03F 3/45188; H03F 3/45246; H03F 3/45192; H03F 3/45475; H03F 3/72; H03F 3/45183; H03F 3/14; H03F 2203/45082; H03F 2203/45138; H03F 2203/45418; H03F 2203/45534; H03F 2203/45616; H03F 2203/7227; H03F 1/34; H03F 1/30
USPC ........................ 330/9, 252, 216; 327/307, 336
See application file for complete search history.

(56) References Cited

U.S. PATENT DOCUMENTS

| | | | | |
|---|---|---|---|---|
| 6,239,643 B1 * | 5/2001 | Takatsu | .......................... | 327/307 |
| 7,265,622 B1 * | 9/2007 | Koike | ............................ | 330/253 |
| 7,417,459 B2 * | 8/2008 | Wilson et al. | .................... | 326/82 |
| 7,965,139 B1 * | 6/2011 | Shook | ............................. | 330/69 |

* cited by examiner

*Primary Examiner* — Lam T Mai
(74) *Attorney, Agent, or Firm* — Kenyon & Kenyon, LLP

(57) ABSTRACT

A digital-to-analog conversion system includes a digital-to-analog converter and an output stage for converting an output signal of the digital-to-analog converter into a voltage range. The output stage includes a first amplifier including a first input for receiving the output signal of the digital-to-analog converter, a first resistance element coupled between a second input and an output of the first amplifier, a second resistance element coupled between the second input of the first amplifier and a ground reference, and a third resistance element switchably coupled from the second input of the first amplifier to an offset voltage.

27 Claims, 10 Drawing Sheets

AMPLIFYING SYSTEM

FIELD OF THE INVENTION

The present disclosure is generally directed to amplifying systems that include digital-to-analog converters (DACs) and output stages of the DACs, in particular, to digital-to-analog conversion systems that include highly-linear and area efficient output stages.

BACKGROUND INFORMATION

A digital-to-analog converter (DAC) typically drives a load through an output stage that may function as a buffer between the DAC and the load to supply the drive current to the load. Additionally, the output stage may supply voltage of different ranges to the load. For example, the output of the DAC typically has a voltage range of [0, 2.5 v]. An output stage of the DAC may transform the voltage range of [0, 2.5 v] of the DAC to different voltage ranges such as ranges of [0, 5 v], [0, 10 v], [0, 20 v], [−5 v, 5 v], [−10 v, 10 v], or [−20 v, 20 v]. Those ranges that cover only positive voltages are commonly referred to as unipolar voltage ranges, and those ranges that cover both positive and negative voltages are commonly referred to as bipolar voltage ranges.

The output stage of the DAC may achieve unipolar ranges by different combinations of resistors via software controlled switches. To achieve bipolar ranges, however, the output stage of the DAC may further include an offset voltage that shifts the output into negative voltage territories. Presently, the switching between unipolar and bipolar outputs is achieved through a bypass switch which is connected between a node for the offset voltage and a ground reference. Thus, when the bypass switch is engaged for unipolar ranges, a signal at the node that provides offset voltage is directed to the ground, thus bypassing the offset voltage. When the bypass switch is disengaged, the offset voltage is kicked in so that the output stage may supply bipolar ranges.

The bypass switch is commonly implemented by using a metal-oxide-semiconductor field-effect transistor (MOSFET) device which may exhibit nonlinear resistance which varies as a function of the current passing through the MOSFET device. The nonlinear resistance of the MOSFET device in the signal path may cause the overall integral non-linearity (INL) of the DAC to suffer. Larger MOSFET devices may reduce the INL caused by the nonlinear resistance of the MOSFET device. However, larger MOSFET devices occupy larger circuit areas and may leak current at high temperatures.

SUMMARY

Embodiments may include a digital-to-analog conversion system that may include a digital-to-analog converter and an output stage for converting an output signal of the digital-to-analog converter into a voltage range. The output stage may include a first amplifier including a first input for receiving the output signal of the digital-to-analog converter, a first resistance element coupled between a second input and an output of the first amplifier, a second resistance element coupled between the second input of the first amplifier and a ground reference, and a third resistance element switchably coupled (e.g., coupled via switches) from the second input of the first amplifier to an output and input of a second amplifier.

Embodiments may include a digital-to-analog conversion system that may include a digital-to-analog converter and an output stage for converting an output signal of the digital-to-analog converter into a voltage range. The output stage may include a first amplifier including a first input for receiving the output signal of the digital-to-analog converter, a first resistance element coupled between a second input and an output of the first amplifier, serially-connected second and third resistance elements coupled between the second input of the first amplifier and a ground reference, and a fourth resistance element switchably coupled (e.g., coupled via switches) from an interconnect node of the second and third resistance elements to an output and an input of a second amplifier.

Embodiments may include a digital-to-analog conversion system that may include a digital-to-analog converter and an output stage for converting an output signal of the digital-to-analog converter into a voltage range. The output stage may include a first amplifier including a first input for receiving the output signal of the digital-to-analog converter, serially-connected first and second resistance elements coupled from a second input to an output of the first amplifier, a third resistance element coupled between the second input of the first amplifier and a ground reference, and a fourth resistance element switchably coupled (e.g., coupled via switches) from an interconnect node of the first and second resistance elements to an output and an input of a second amplifier.

DETAILED DESCRIPTION

Figure 1:
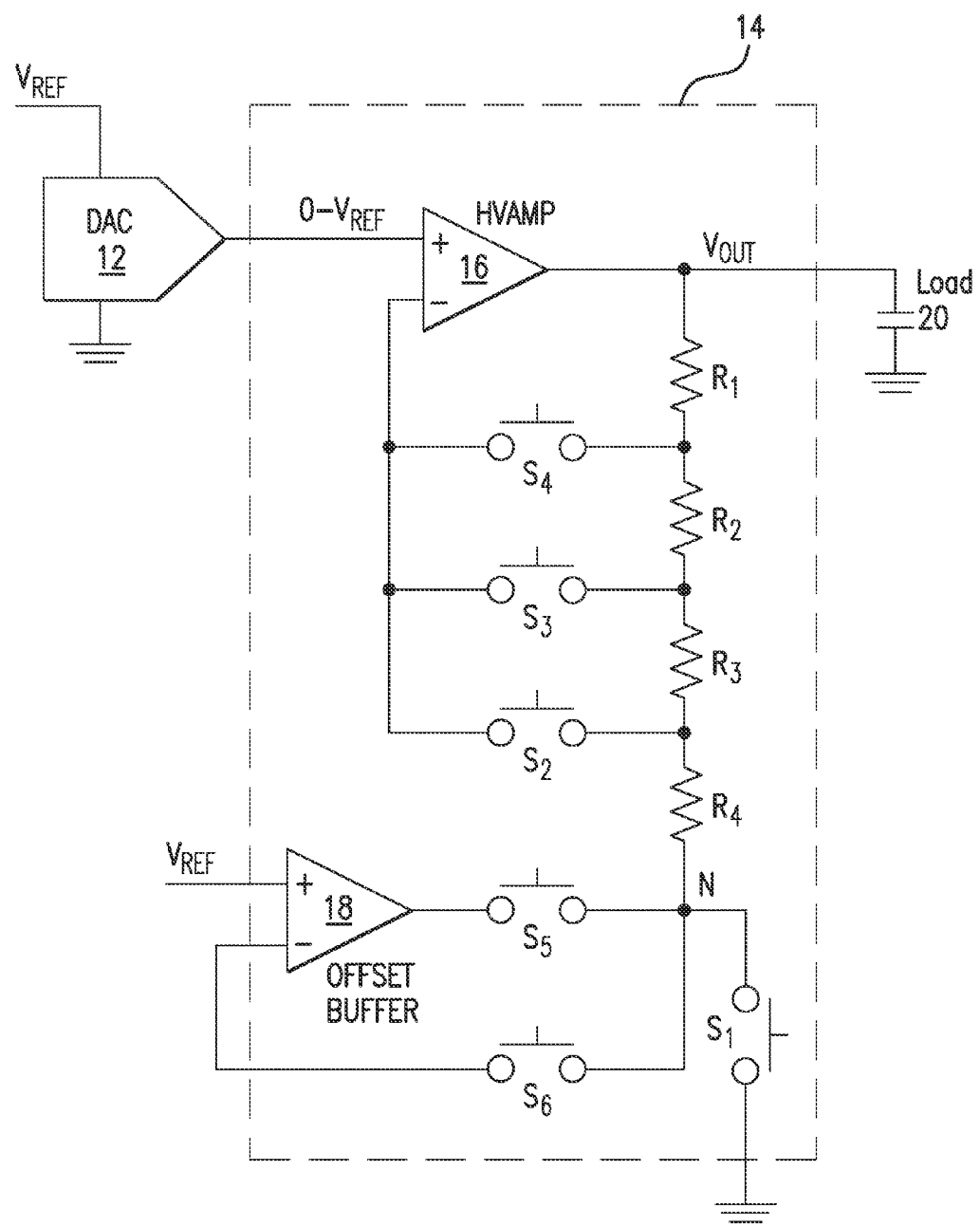
FIG. 1 illustrates a digital-to-analog conversion system.

FIG. 1 illustrates a digital-to-analog conversion system that includes a digital-to-analog converter (DAC) and an output stage of the DAC that may generate different voltage ranges. The digital-to-analog conversion system may include a DAC 12, which may be a resistor-string DAC, and an output stage 14. The output stage 14 may further include first and second amplifiers 16, 18, a plurality of resistors R1-R4, and a plurality of switches S1-S6. The DAC 12 may convert digital codes into corresponding analog voltages in a specific voltage range such as the voltage range of [0, $V_{REF}$], e.g. [0, 2.5 v]. The output stage 14 may be coupled to the output of DAC 12 to act as a buffer for the DAC 12 and may convert the output of the DAC 12 into different voltage ranges through amplifiers 16, 18, and different combinations of resistors R1-R4 via switches S1-S6.

As shown in FIG. 1, a non-inverting input of amplifier 16 may receive the voltage output from the DAC 12. Amplifier 16 may act as a buffer between the DAC 12 and load device 20, where the load may be capacitive and/or resistive. Resistors R1-R3 may be selectively coupled between the output and the inverting input of amplifier 16, via switches S2-S4, to generate Vout in different voltage ranges. The output Vout of amplifier 16 may be connected to load device 20. Resistor R4 may be coupled between resistor R3 and a node N at which a voltage offset is selectively supplied by amplifier 18 via switches S5, S6. Node N is also selectively coupled to the ground reference via switch S1. Thus, if switch S2 is engaged (ON) and switches S3, S4 are disengaged (OFF), resistors R1-R3 are serially connected between the inverting input and the output of amplifier 16 while resistor R4 is coupled between the inverting input and node N. If switch S3 is engaged and switches S2, S4 are disengaged, resistors R1 and R2 are serially connected between the inverting input and the output of amplifier 16 while resistors R3 and R4 are serially connected between the inverting input and node N. If switch S4 is engaged and switches S2, S3 are disengaged, resistor R1 is connected between inverting input and the output of amplifier 16 while resistors R2-R3 are serially connected between the inverting input and node N. At any time, only one of switches S2-S4 is selectively engaged.

To generate unipolar voltage ranges, switch S1 is engaged while switches S5, S6 are disengaged. Therefore, node N is connected to the ground reference under the unipolar mode. In this scenario, the signal current may flow through switch S1 which is commonly a software controlled MOSFET device exhibiting nonlinear resistance. The nonlinear resistance of switch S1 may increase the undesirable INL component of the output Vout. On the other hand, to generate bipolar voltage ranges, switches S5, S6 are engaged while switch S1 is disengaged. In this scenario, node N is set to a positive voltage through the offset buffer (or amplifier 18). The positive voltage at node N causes a negative voltage offset at the output Vout. In this way, Vout may be in bipolar ranges including negative voltages.

By selectively engaging switches S1-S6, the output stage 14 may output voltages in unipolar or bipolar ranges. For example, when the resistances of resistors R1-R4 are 12 k, 6 k, 3 k, and 3 k, respectively, voltage ranges of [0, 20 v], [10 v, 10 v], [0, 10 v], [−5 v, 5 v], and [0, 5 v] may be generated in accordance with the switches as shown in Table 1.

TABLE 1

| Range | Closed-loop gain | Voltage at node N | ON switches | OFF switches |
|---|---|---|---|---|
| [0, 20 v] | 8 | 0 | S1, S2 | S3, S4, S5, S6 |
| [−10 v, 10 v] | 8 | 1.428 v | S2, S5, S6 | S1, S3, S4 |
| [0, 10 v] | 4 | 0 | S1, S3 | S2, S4, S5, S6 |
| [−5 v, 5 v] | 4 | 1.6667 | S3, S5, S6 | S1, S2, S4 |
| [0, 5 v] | 2 | 0 | S1, S4 | S2, S3, S5, S6 |

For unipolar ranges, switch S1 is engaged so that a signal current may flow through switch S1 which is commonly a MOSFET device. As the digital codes at the input of the DAC 12 vary from zero to the full scale, the current signal passing through switch S1 likewise varies accordingly. As discussed before, the resistance of switch S1 at the ON state may exhibit nonlinearity and change as a function of the current passing through switch S1. This nonlinear variation in switch S1 with respect to the resistance of S1 causes the closed-loop gain to vary non-linearly—which results in INL. A large MOSFET device may help reduce INL, but may not be practical because of the bulky size and current leakages at high temperature. Another aspect of the digital-to-analog conversion system as shown in FIG. 1 is that, for bipolar ranges, the voltage at node N needs to be generated and is therefore subject to errors which may create offset errors in Vout. Furthermore, the elements used to generate voltage at node N may add extra noise to Vout.

It is noted that switch S1 does not play any role in determining a closed-loop gain for those bipolar ranges, for example, because switch S1 is disengaged. However, for unipolar ranges, the ON resistance of switch S1 is added to the existing resistors R1-R4 and affects the closed-loop gain. For this reason, gain errors for unipolar ranges are more severe than those for bipolar ranges. The difference between unipolar and bipolar gain errors may require an additional gain error trimming process, and thus incur additional costs and require additional circuit areas.

Therefore, there is a need to reduce the non-linearity caused by switching in signal paths and balance the gain errors between unipolar and bipolar ranges. Embodiments of the present disclosure eliminate switches in signal paths, thereby reducing INL and balancing the gain errors between unipolar and bipolar ranges.

Figure 2:
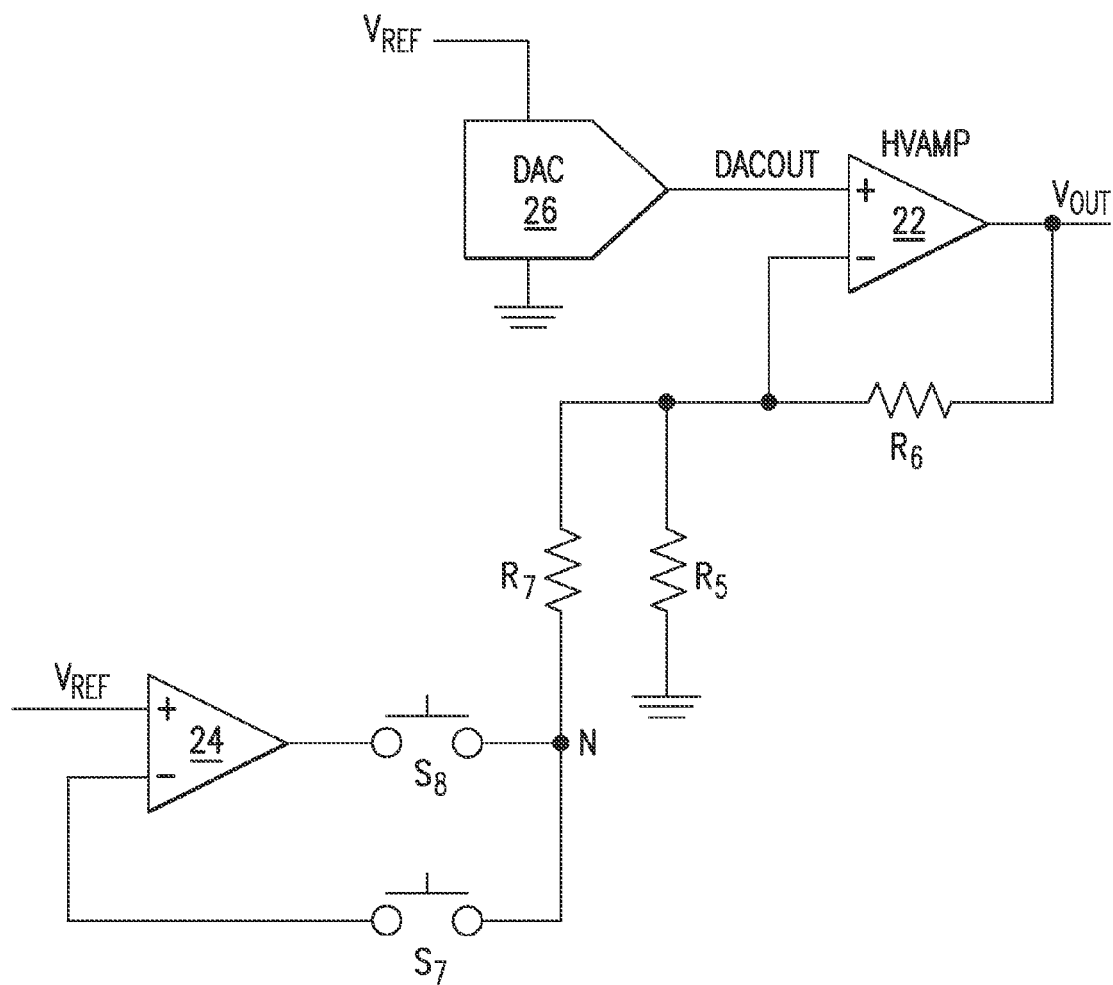
FIG. 2 illustrates a digital-to-analog conversion system that includes an output stage of a digital-to-analog converter (DAC) according to an embodiment.

FIG. 2 illustrates a digital-to-analog conversion system that includes an output stage of a DAC 26 according to an embodiment. Compared to the DAC output stage 14 as shown in FIG. 1, the output stage as shown in FIG. 2 eliminates S1 switch and the associated INL, balance the gain with respect to uni- and bi-polar voltage ranges, and eliminate the need to generate arbitrary reference voltages. As there is no need for the large S1 switch, the current leakage caused by the large switch may be reduced, and the DAC output stage may operate under high temperatures.

Referring to FIG. 2, the output stage according to the embodiment may include amplifiers 22, 24, switches S7, S8, and resistors R5, R6, R7. The non-inverting input of amplifier 22 may receive the output from the DAC to which the output stage is coupled. Resistor R6 is coupled between the output (Vout) and the inverting input of amplifier 22. Resistor R5 is coupled between the inverting input of the amplifier 22 and a ground reference. The non-inverting input of amplifier 24 may receive an offset voltage to provide a voltage Vref at node N to the inverting input of amplifier 22 through resistor R7 and switches S7, S8.

In operation, switches S7, S8 under control by programmable instructions may be engaged (ON) for bipolar ranges, and alternatively, may be disengaged (OFF) for unipolar ranges. The closed loop gain for the output stage as shown in FIG. 2 (i.e., when S7 and S8 are engaged) is 1+R6/R5+R6/R7. The gain from Node N to Vout=−R6/R7. Since the voltage at node N is Vref, the resistance values of R6 and R7 may be selected to set the correct offset voltage for the bipolar ranges. In unipolar ranges, since switches S7, S8 are disengaged, the effective resistance in the signal line of R7 is infinite. Since the signal line does not include a switch, the serial combination of R5 and R6 may be used as a voltage divider and R5+R6=Rtotal. The resistance values of R5, R6, and R7 may be resolved by solving these equations for given a Rtotal and gain. Resistors R5, R6, and R7 may be replaced by two or more resistors connected in series and/or parallel, for example as further described herein in relation to FIG. 3 and FIG. 10.

Figure 3:
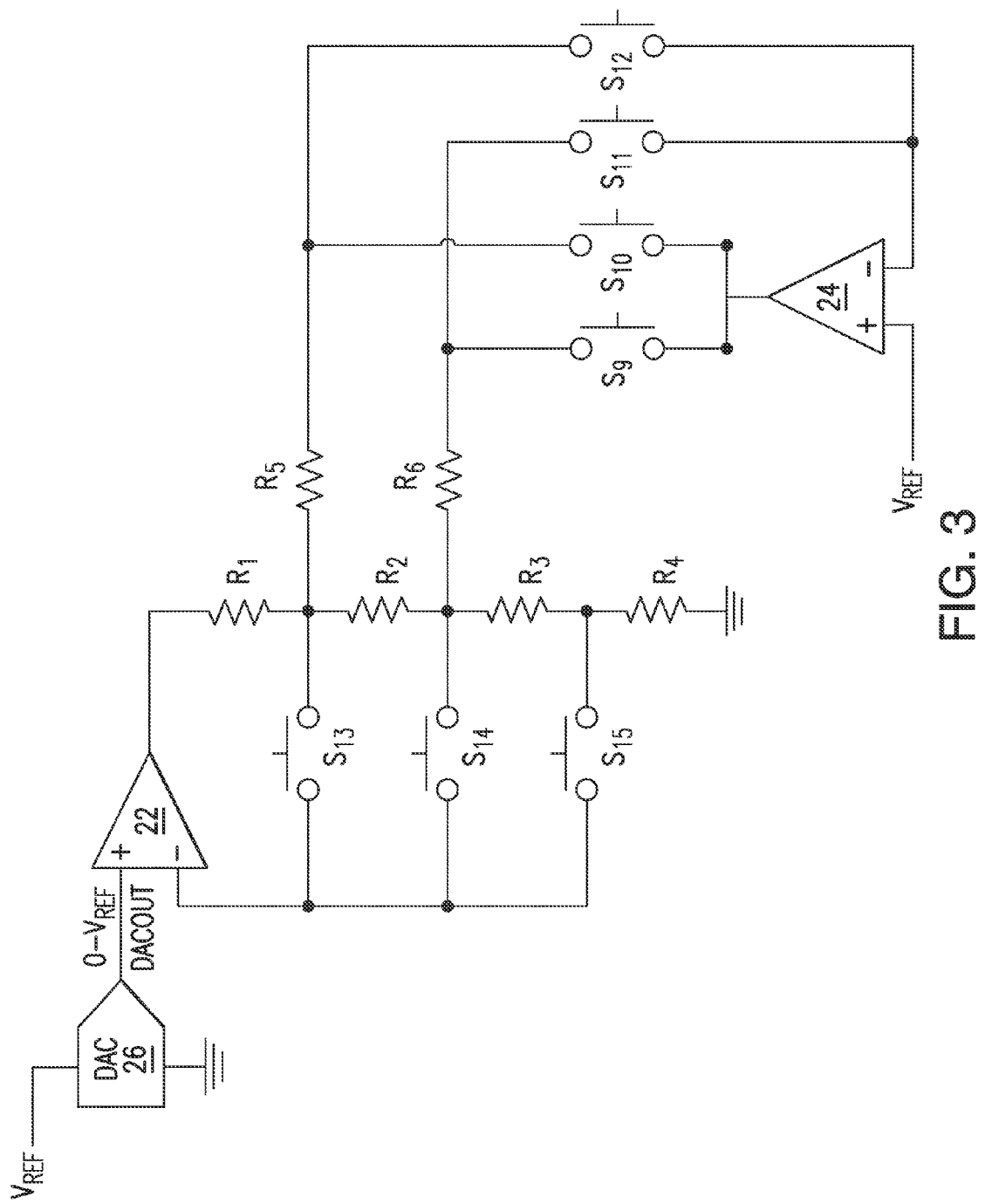
FIG. 3 illustrates a digital-to-analog conversion system that generates multiple output ranges according to an embodiment.

For more output ranges, more resistors and switches may be similarly added. For example, when Rtotal=24K, FIG. 3 illustrates a circuit arrangement that may generate multiple output voltage ranges as shown correspondingly in Table 2, where Rtotal is the sum of R1+R2+R3+R4, and example values of the resistors are as follows: R1=12 k, R2=6 k, R3=3 k, R4=3 k, R5=6 k, and R6=4.5 k.

TABLE 2

| Range | Closed-loop gain | ON switches | OFF switches |
| --- | --- | --- | --- |
| [0, 20 v] | 8 | S15 | S9-S14 |
| [−10 v, 10 v] | 8 | S9, S11, S14 | S10, S12, S13, S15 |
| [0, 10 v] | 4 | S14 | S9-S13, S15 |
| [−5 v, 5 v] | 4 | S10, S12, S13 | S9, S11, S14, S15 |
| [0, 5 v] | 2 | S13 | S9-S12, S14, S15 |

Figure 4:
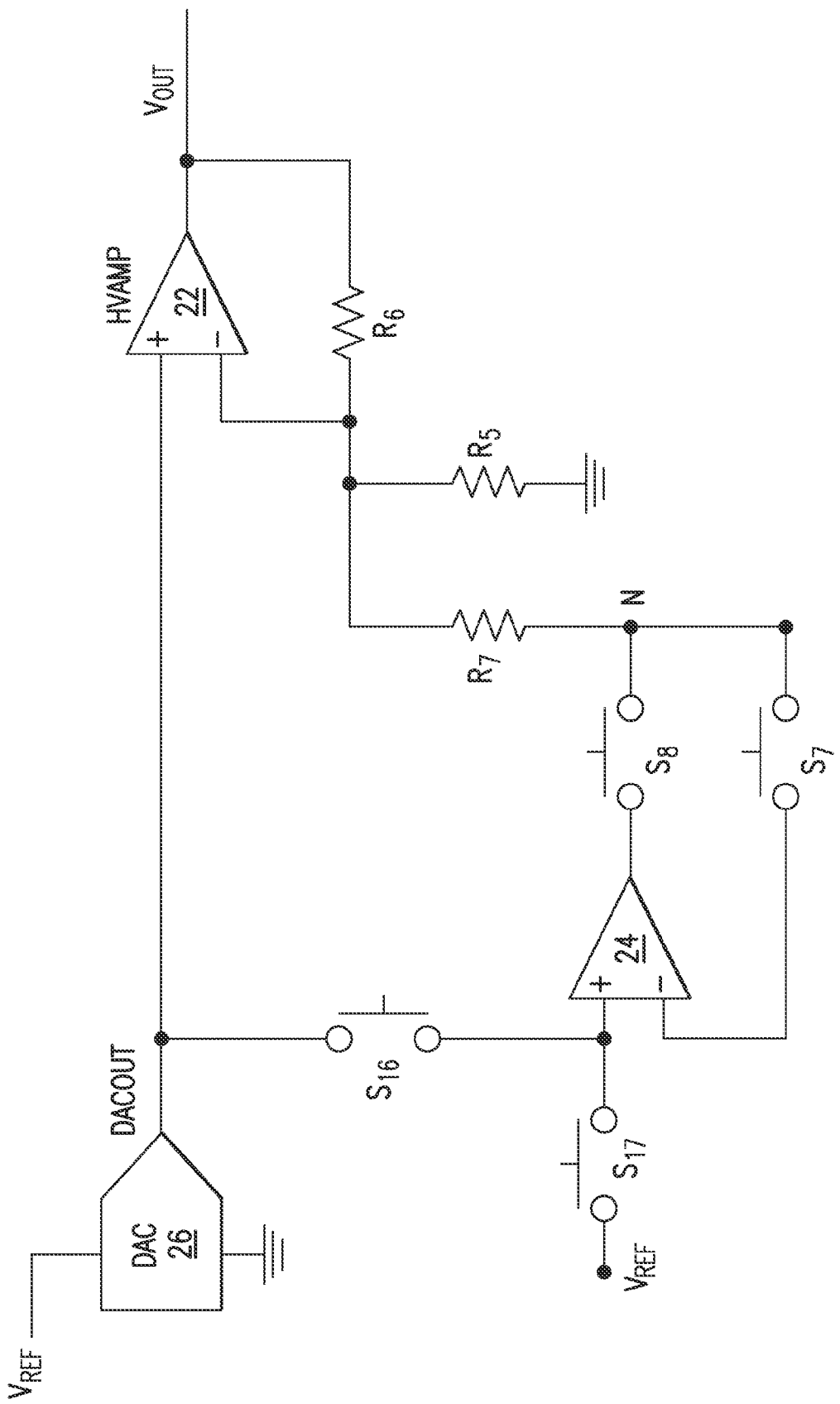
FIG. 4 illustrates a DAC output stage with reduced noise coupling according to an embodiment.

For the embodiment as shown in FIG. 2 under unipolar modes, both switches S7, S8 are disengaged (OFF), meaning that an end of resistor R7 is floating under unipolar modes which may result in noise coupling. FIG. 4 illustrates a DAC output stage for a DAC 26 according to an embodiment. To avoid the noise coupling under unipolar modes, switches S7, S8 may be kept on, but the non-inverting input of amplifier 24 may be connected to DACOUT (or the output from the DAC) so that both ends of the resistor R7 may be at the same potential and no current may flow through R7. Switch S16 may be coupled between the non-inverting input of amplifier 24 and DACOUT while switch S17 is coupled between the reference voltage Vref and the non-inverting input of amplifier 24. In operation, under unipolar modes, switch S16 may be engaged (ON) and S17 may be disengaged (OFF). In contrast, under bipolar modes, switch S16 may be disengaged, and switch S17 may be engaged. In this way, the potential as applied to resistor R7 is the same, thereby reducing noise coupling.

Embodiments as shown in FIGS. 2-4 have the advantage of no switching in the signal paths, or no switch through which varying current signal flows as the output the DAC varies from a zero scale to a full scale. For this reason, the linearity of the output is not affected by elements other than the DAC. Since there is no switching in the signal path, the switches used may be of minimum sizes. Gain errors are only due to resistor mismatching, and there is no systematic gain error difference between unipolar and bipolar ranges. Further, since the reference voltage Vref is directly used for generating the output ranges, there is no need to generate an intermediate (and arbitrary) voltage at node N. The current leakage under high temperatures is also drastically reduced.

Figure 5:
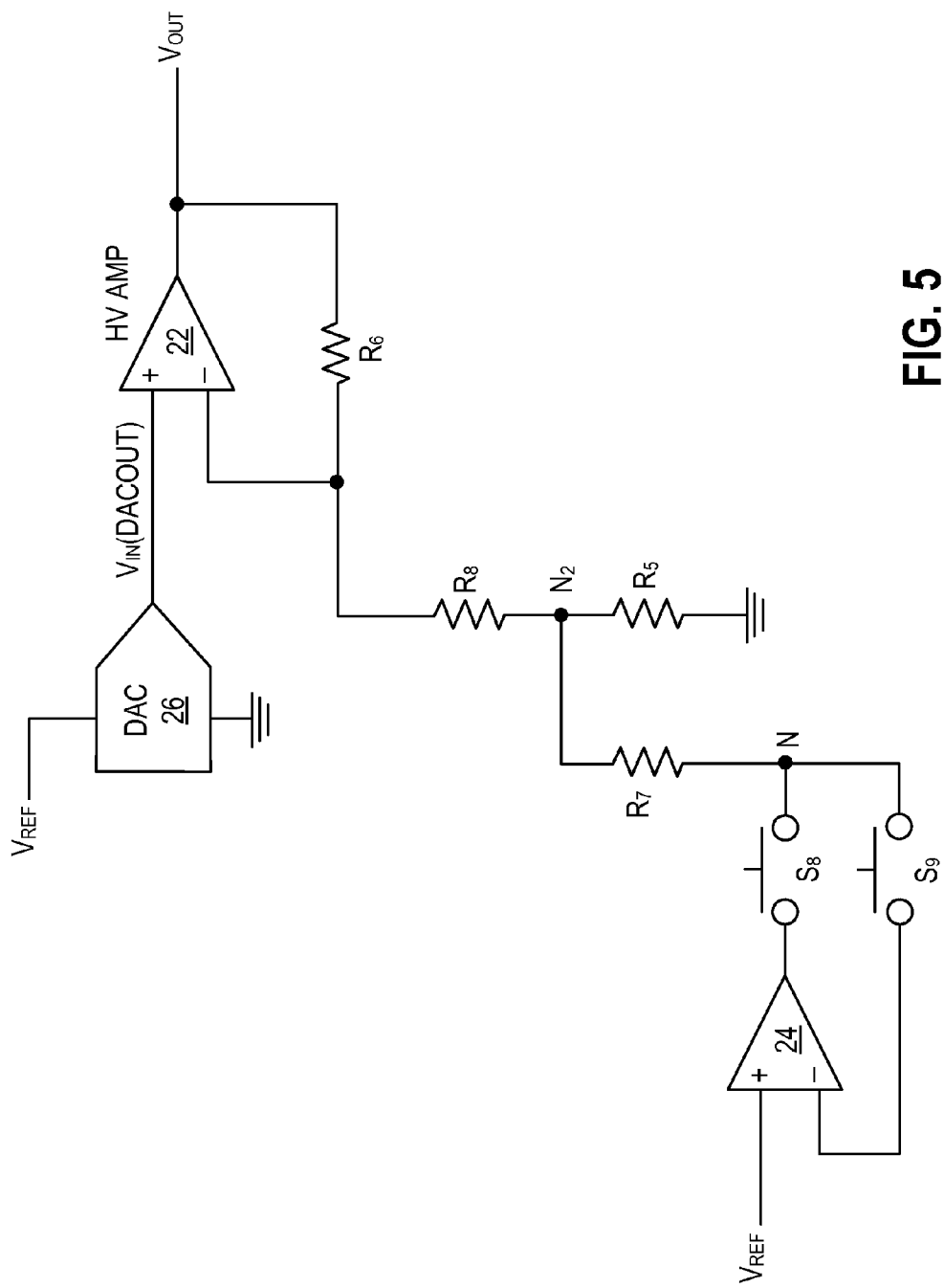
FIG. 5 illustrates a DAC output stage according to another embodiment.

FIG. 5 illustrates a DAC output stage for a DAC 26 according to an alternative embodiment. Compared to FIG. 2, the output stage circuit as shown in FIG. 5 includes an additional resistor R8 that is coupled between the node $N_2$ and the inverting input of amplifier 22. The resistance values of R5-R8 may be determined based on the output ranges, the desired gain (g) from Vin to Vout, and the desire offset (Voff). Additionally, R5+R6+R8=Rtotal, where Rtotal may be pre-specified in accordance with a noise factor. Based on these relationships, the resistance values of R5-R8 may be determined.

In operation, switches S8, S9 are disengaged during unipolar modes, and are engaged during bipolar modes so that the voltage source Vref may provide an offset voltage for the bipolar modes. Different output voltage ranges may be generated in accordance with the resistance values of R5-R8.

Figure 6:
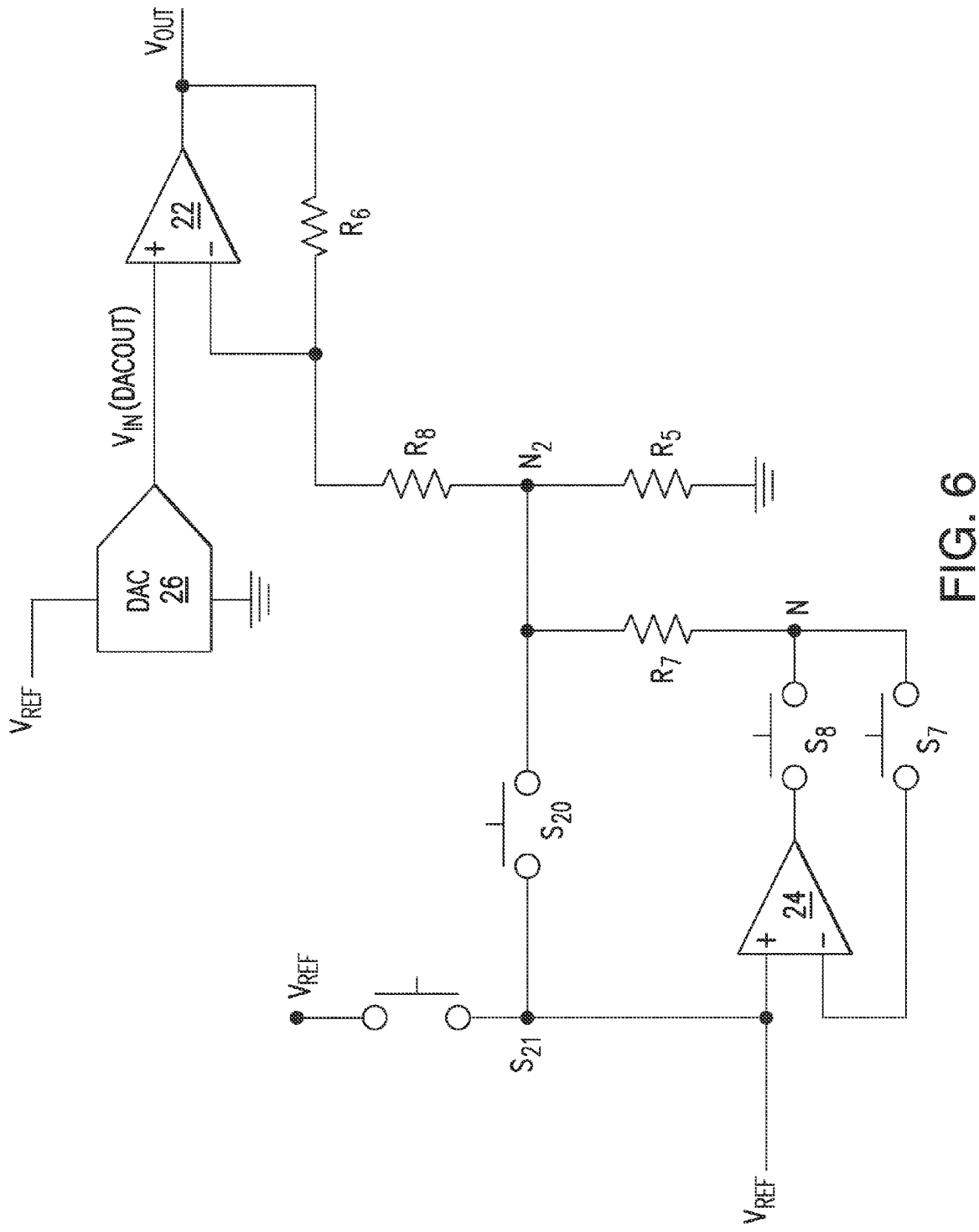
FIG. 6 illustrates a DAC output stage according to an alternative embodiment.

FIG. 6 illustrates another variant DAC output stage for a DAC 26 according to an embodiment. Compared to the embodiment of FIG. 5, the circuit as shown in FIG. 6 may include additional switches S20, S21 that may be switchably engaged during the unipolar modes or the bipolar modes. As shown in FIG. 6, switch S20 may be coupled between the non-inverting input of amplifier 24 and the interconnect node between resistors R5 and R8, and switch 21 may be coupled between a Vref and non-inverting input of amplifier 24. In operation, S20 may be engaged (ON) and S21 may be disengaged (OFF) under the unipolar modes, and S20 is disengaged (OFF) and S21 is engaged (ON) under the bipolar modes. In this way, compared to the circuit as shown in FIG. 5, the noise coupling is significantly reduced. The resistance values for R5-R8 of FIG. 6 may be determined in a manner similar to FIG. 5.

Figure 7:
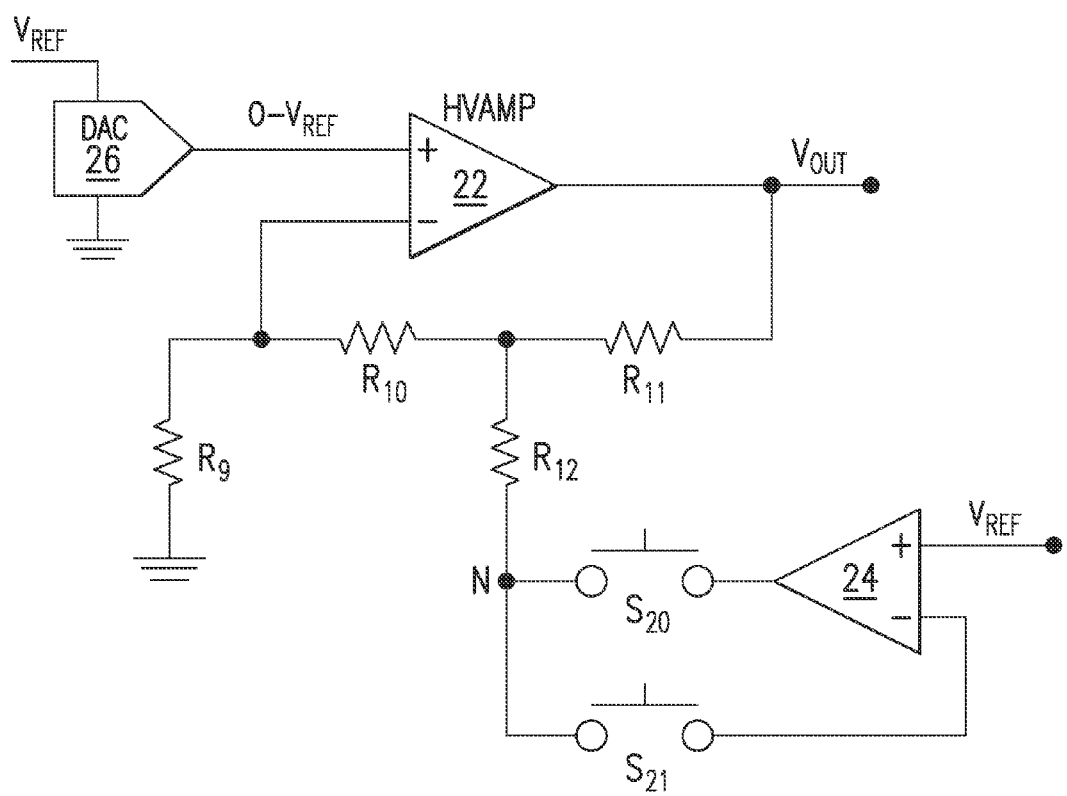
FIG. 7 illustrates a DAC output stage according to another embodiment.

FIG. 7 illustrates a DAC output stage according to an alternative embodiment. Referring to FIG. 7, the output stage may include amplifiers 22, 24, resistors R9-R12, and switches S20, S21. Amplifier 22 may include a non-inverting input that receives input voltage Vin (e.g., an output voltage from a DAC). Resistor R9 may be coupled between the inverting input of amplifier 22 and a ground reference. Resistors R10, R11 may be connected from the inverting input to an output of amplifier 22. The output of amplifier 22 may provide the voltage output Vout. Amplifier 24 may provide an offset voltage through resistor R12 and switches S20, S21, where resistor R12 is coupled to the interconnection between resistors R10 and R11.

Figure 8:
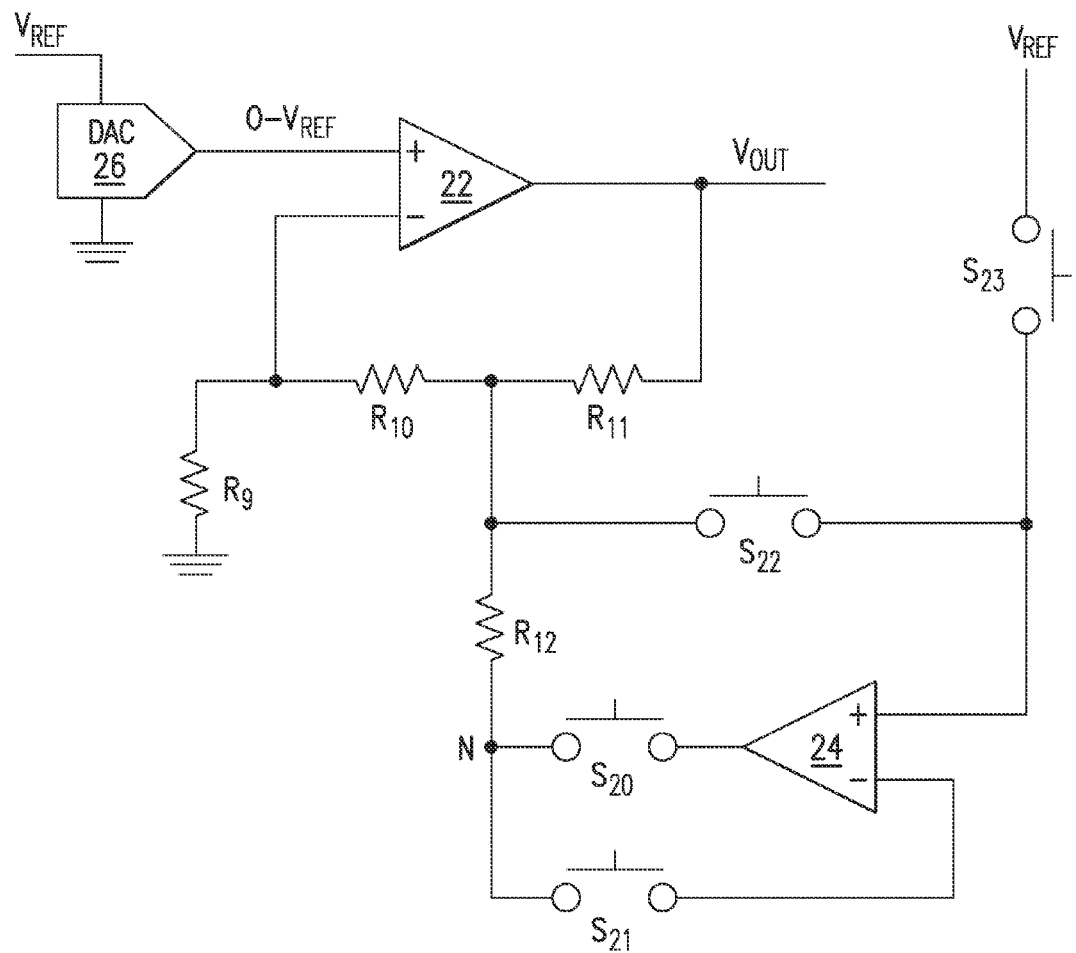
FIG. 8 illustrates a variant output stage according to an alternative embodiment.

In operation, switches S20, S21 may be disengaged (OFF) during unipolar modes, and may be engaged (ON) to provide offset voltage during bipolar modes. The resistance values of resistors R9-R10 may be determined to produce different voltage ranges. One aspect of the output stage as shown in FIG. 7 is that resistor R12 may be floating during the unipolar modes, resulting in noise coupling. To address this, both ends of R12 may be arranged to have the same voltage potential so that no current may go through resistor R12 during the unipolar mode. FIG. 8 illustrates a variant output stage according to an embodiment. Compared to FIG. 7, the circuit as shown in FIG. 8 may include additional switches S22, S23 in which S23 is coupled between a reference voltage Vref and the non-inverting input of amplifier 24, and switch S23 is coupled between the non-inverting input of amplifier 24 and the interconnection of resistors R10 and R11. In operation, switch S22 may be engaged and switch S23 may be disengaged during unipolar modes so that both ends of resistor R12 are at the same voltage potential. In bipolar modes, switch S22 may be disengaged and switch S23 may be engaged so that an offset voltage may be supplied through amplifier 24.

Figure 9A:
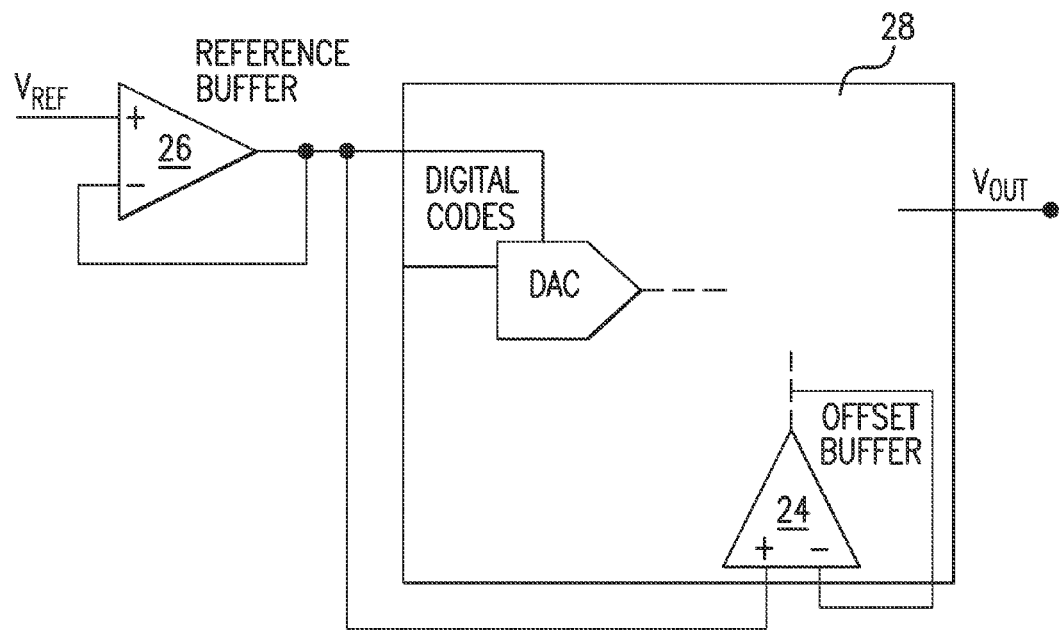
FIG. 9A illustrates an output stage that includes a reference buffer according an embodiment.
Figure 9B:
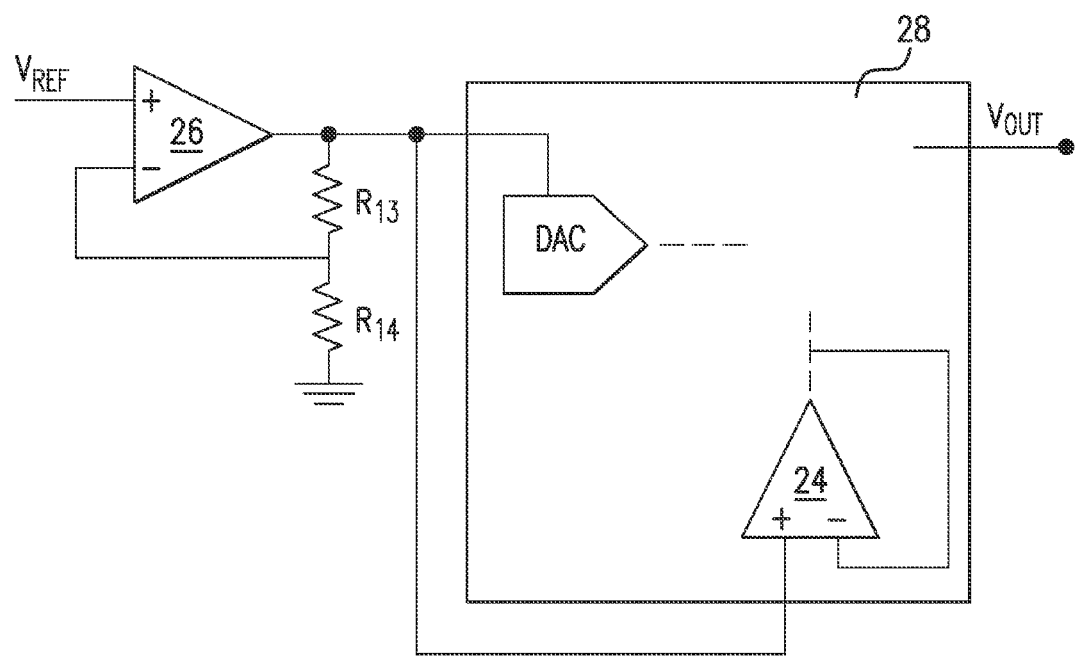
FIG. 9B illustrates an output stage that includes a gain-up reference buffer according an embodiment.

The reference voltages may be supplied through a reference buffer. FIG. 9A illustrates an output stage that includes a reference buffer according an embodiment. As shown in FIG. 9A, circuit block 28 may represent an output stage circuit as shown in FIGS. 2-8. An amplifier 26 may serve as the reference buffer whose output may simultaneously supply a reference voltage to a DAC and to the non-inverting input of the offset buffer. The inverting input of the offset buffer may be connected to the output of the output stage 28. One way to reduce the noise at the output is to reduce the gain for the HV amplifier. For those high output ranges (e.g., 0-20 v and −10 v-10 v) the Vref may be internally gained up (e.g., from 0-2.5 v to 0-4 v) so that the gain of the amplifier may be reduced (from 8 to 5). FIG. 9B illustrates an output stage that includes a voltage gain-up according to an embodiment. To gain up the voltage, a resistor ladder including resistors R13 and R14 is coupled to the output of the reference buffer 26 to raise the voltage supplied to the DAC and the offset buffer. In this way, the noise component at the output may be further reduced.

Figure 10:
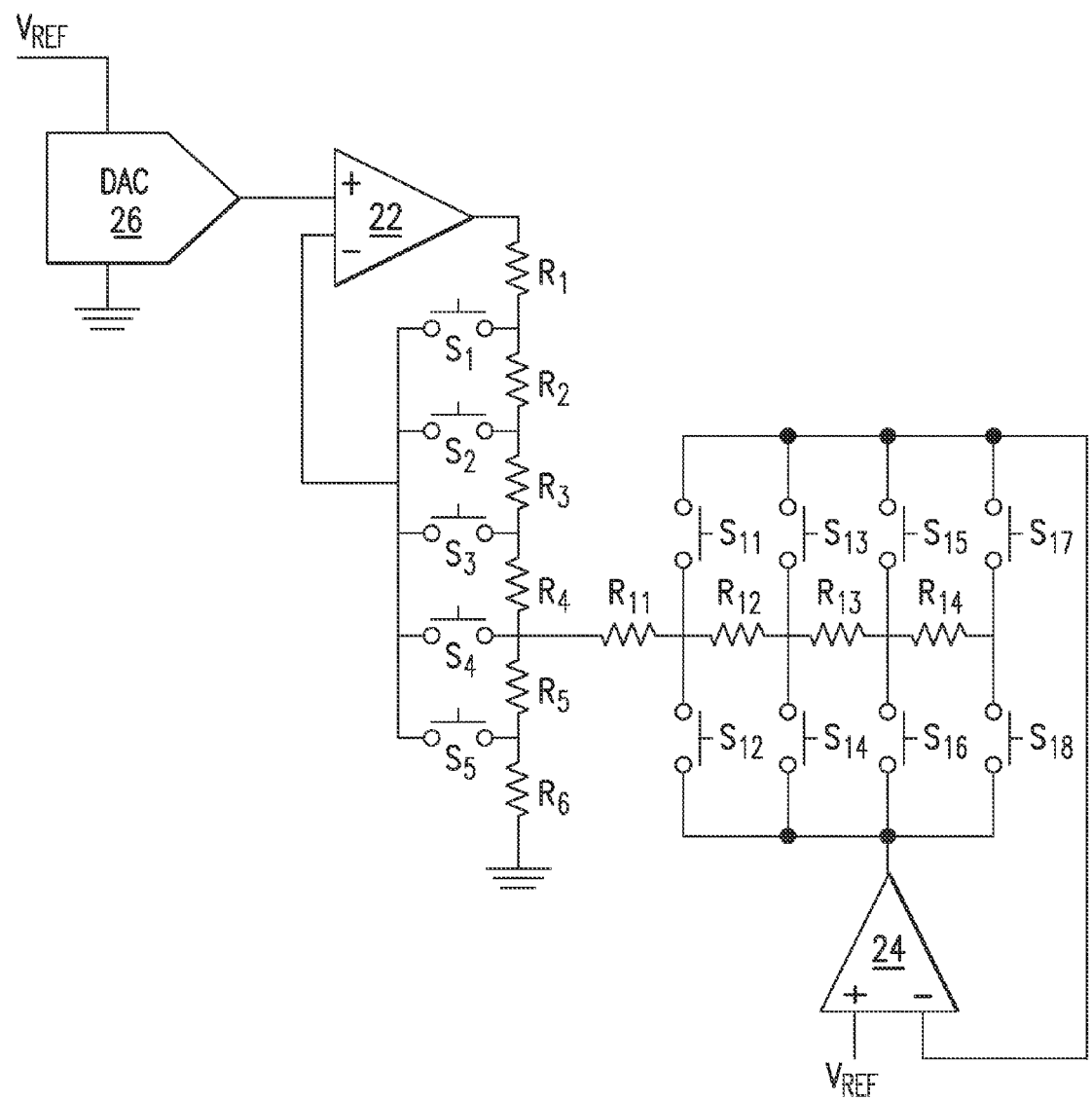
FIG. 10 illustrates a digital-to-analog conversion system that generates multiple output ranges according to another embodiment.

FIG. 10 illustrates a circuit arrangement capable of generating multiple output voltage ranges and including serially-connected resistors. The circuit arrangement of FIG. 10 and FIG. 3 may operate in the manner described for FIG. 2 unless otherwise noted herein. Compared with FIG. 2, FIG. 10 replaces the first resistance element R7 and the second resistance element R5 of FIG. 2 with a first plurality of serially-connected resistors R1-R6, and replaces the third resistance element R6 of FIG. 2 with a second plurality of serially-connected resistors R11-R14. For example, resistors R1-R6 may be coupled between an output of amplifier 22 and a ground reference, where interconnect nodes of resistors R1-R6 are coupled via respective switches S1-S5 to a first input of amplifier 22. Resistors R11-R14 may be coupled to an interconnect node of resistors R1-R6. Resistors R11-R14 may also be coupled to the of amplifier 24 via respective switches S12, S14, S16, and may be coupled to an input of amplifier 24 via respective switches S11, S13, S15. Although not shown, the first, second, and third resistance elements R5, R6, and R7 of FIG. 2 may also be replaced by resistors connected in parallel.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. An amplifying system, comprising:
an analog input; and
an output stage that converts the analog input into a voltage range, the output stage including:
a first amplifier including a first input for receiving the analog input;
a first resistance element coupled between a second input and an output of the first amplifier;
a second resistance element coupled between the second input of the first amplifier and a ground reference; and
a third resistance element switchably coupled from the second input of the first amplifier to an offset voltage.

2. The amplifying system of claim 1, wherein the amplifying system is at least one of: a digital-to-analog conversion system, and a system that amplifies a unipolar input voltage span to at least one of a unipolar and a bipolar output span.

3. The amplifying system of claim 1, wherein the output of the first amplifier outputs a bipolar voltage range when the offset voltage is switched on to the second input of the first amplifier.

4. The amplifying system of claim 1, wherein the output of the first amplifier outputs a unipolar voltage range when the offset voltage is switched off from the second input of the first amplifier.

5. The amplifying system of claim 1, wherein the first resistance element includes a plurality of serially-connected resistors, each of which is switchably coupled between the second input of the first amplifier and the output of the first amplifier.

6. The amplifying system of claim 5, wherein the second resistance element includes a plurality of serially-connected resistors, and interconnect nodes of the plurality of serially-connected resistors of the second resistance element are each switchably coupled between the second input of the first amplifier and the ground reference.

7. The amplifying system of claim 5, further comprising a second amplifier; and wherein the third resistance element includes a plurality of resistors coupled to (a) interconnect nodes of the plurality of resistors of the first and second resistance elements and (b) via respective switches to an output and a second input of the second amplifier.

8. The amplifying system of claim 7, wherein the output stage outputs one of unipolar voltage ranges and bipolar voltage ranges, as a function of switched on resistors.

9. A digital-to-analog conversion system, comprising:
a digital-to-analog converter; and
an output stage for converting an output signal of the digital-to-analog converter into a voltage range, the output stage including:
a first amplifier including a first input for receiving the output signal of the digital-to-analog converter;
a second amplifier that supplies an offset voltage and includes a first input and a second input;
a first resistance element coupled between a second input and an output of the first amplifier;
a second resistance element coupled between the second input of the first amplifier and a ground reference;
a first switch;
a second switch; and
a third resistance element;
wherein the third resistance element is coupled between the second input of the first amplifier and the second input of the second amplifier via the first switch; and
wherein the third resistance element is coupled between the second input of the first amplifier and an output of the second amplifier via the second switch.

10. The digital-to-analog conversion system of claim 9, wherein the output stage further includes:
a third switch coupled between the first input of the second amplifier and the first input of the first amplifier; and
a fourth switch coupled between a voltage reference and the first input of the second amplifier;
wherein the third switch is engaged and the fourth switch is disengaged during a unipolar output mode, and the third switch is disengaged and the fourth switch is engaged during a bipolar output mode.

11. An amplifying system, comprising:
an analog input; and
an output stage for converting the analog input into a voltage range, the output stage including:
a first amplifier including a first input for receiving the analog input;
a first resistance element coupled between a second input and an output of the first amplifier;
serially-connected second and third resistance elements coupled between the second input of the first amplifier and a ground reference; and
a fourth resistance element switchably coupled from an interconnect node between the second and third resistance elements to an offset voltage.

12. The amplifying system of claim 11, wherein the output of the first amplifier outputs a bipolar voltage range when the offset voltage is switched on to the second input of the first amplifier, and the output of the first amplifier outputs a unipolar voltage range when the offset voltage is switched off from the second input of the first amplifier.

13. The amplifying system of claim 11, wherein the first resistance element includes a plurality of serially-connected resistors, each of which is switchably coupled between the second input and the output of the first amplifier.

14. The amplifying system of claim 13, wherein the second and the third resistance elements each includes a plurality of serially-connected resistors, each of which is switchably coupled between the second input of the first amplifier and the ground reference.

15. The amplifying system of claim 14, further comprising a second amplifier; and wherein the fourth resistance element includes a plurality of resistors having intermediate nodes switchably connected between the output of the second amplifier and interconnect nodes of the serially-connected resistors of at least one of: the first, the second, and the third resistance elements.

16. The amplifying system of claim 14, wherein the output stage outputs one of unipolar voltage ranges and bipolar voltage ranges as a function of switched on resistors.

17. A digital-to-analog conversion system, comprising:
a digital-to-analog converter; and
an output stage for converting an output signal of the digital-to-analog converter into a voltage range, the output stage including:
a first amplifier including a first input for receiving the output signal of the digital-to-analog converter;
a second amplifier that supplies an offset voltage and includes a first input and a second input;
a first resistance element coupled between a second input and an output of the first amplifier;
serially-connected second and third resistance elements coupled between the second input of the first amplifier and a ground reference;
a first switch;
a second switch; and
a fourth resistance;
wherein the fourth resistance is coupled between the second input of the first amplifier and the second input of the second amplifier via the first switch; and
wherein the fourth resistance is coupled between the second input of the first amplifier and an output of the second amplifier via the second switch.

18. The digital-to-analog conversion system of claim 17, wherein the output stage further includes:
a third switch coupled between the first input of the second amplifier and the interconnect node of the second and third resistance elements; and
a fourth switch coupled between a voltage reference and the first input of the second amplifier;
wherein the third switch is engaged and the fourth switch is disengaged during a unipolar output mode, and the third switch is disengaged and the fourth switch is engaged during a bipolar output mode.

19. An amplifying system, comprising:
an analog input; and
an output stage for converting an output signal of the analog input into a voltage range, the output stage including:
a first amplifier including a first input for receiving the analog input;
serially-connected first and second resistance elements coupled from a second input to an output of the first amplifier;
a third resistance element coupled between the second input of the first amplifier and a ground reference; and
a fourth resistance element switchably coupled from an interconnect node of the first and second resistance elements to an offset voltage.

20. The amplifying system of claim 19, wherein the output of the first amplifier outputs a bipolar voltage range when the offset voltage is switched on to the fourth resistance element, and the output of the first amplifier outputs a unipolar voltage range when the offset voltage is switched off from the fourth resistance element.

21. The amplifying system of claim 19, wherein the first and second resistance elements include a plurality of serially-connected resistors, each of which is switchably coupled between the second input and the output of the first amplifier.

22. The amplifying system of claim 21, wherein the fourth resistance element includes a plurality of resistors having intermediate nodes switchably connected between the output of the second amplifier and interconnect nodes of the serially-connected resistors of at least one of: the first, the second, and the third resistance elements.

23. The amplifying system of claim 22, wherein the output stage outputs one of unipolar voltage ranges and bipolar voltage ranges as a function of switched on resistors.

24. A digital-to-analog conversion system, comprising:
a digital-to-analog converter; and
an output stage for converting an output signal of the digital-to-analog converter into a voltage range, the output stage including:
a first amplifier including a first input for receiving the output signal of the digital-to-analog converter;
a second amplifier that supplies an offset voltage and includes a first input and a second input;
serially-connected first and second resistance elements coupled from a second input to an output of the first amplifier;
a third resistance element coupled between the second input of the first amplifier and a ground reference;
a first switch;
a second switch; and
a fourth resistance element;
wherein the fourth resistance element is coupled between an interconnect node of the first and second resistance elements and the second input of the second amplifier via the first switch; and
wherein the fourth resistance element is coupled between the interconnect node of the first and second resistance elements and an output of the second amplifier via the second switch.

25. The digital-to-analog conversion system of claim 24, wherein the output stage further includes:
a third switch coupled between the first input of the second amplifier and the interconnect node of the first and second resistance elements; and
a fourth switch coupled between a voltage reference and the first input of the second amplifier;
wherein the third switch is engaged and the fourth switch is disengaged during a unipolar output mode, and the third switch is disengaged and the fourth switch is engaged during a bipolar output mode.

26. A digital-to-analog conversion system, comprising:
a digital-to-analog converter; and
an output stage for converting an output signal of the digital-to-analog converter into a voltage range, the output stage including:
a first amplifier including a first input that receives the output signal of the digital-to-analog converter;
a second amplifier that supplies an offset voltage;
a first plurality of serially-connected resistors coupled between an output of the first amplifier and a ground reference, wherein interconnect nodes of the first plurality of resistors are coupled via respective switches to a second input of the first amplifier; and a second plurality of serially-connected resistors coupled to (a) an interconnect node of the first plurality of resistors and (b) via respective switches to an output and a second input of the second amplifier.

27. A digital-to-analog conversion system, comprising:
a digital-to-analog converter; and
an output stage for converting an output signal of the digital-to-analog converter into a voltage range, the output stage including:
  a first amplifier including a first input that receives the output signal of the digital-to-analog converter;
  a second amplifier that supplies an offset voltage;
  a first plurality of serially-connected resistors coupled between an output of the first amplifier and a ground reference, wherein interconnect nodes of the first plurality of resistors are coupled via respective switches to a second input of the first amplifier; and
  a second plurality of resistors coupled to (a) interconnect nodes of the first plurality of resistors and (b) via respective switches to an output and a second input of the second amplifier.

* * * * *